United States Patent
Kanda et al.

(10) Patent No.: US 9,343,453 B2
(45) Date of Patent: *May 17, 2016

(54) SEMICONDUCTOR DEVICE

(71) Applicant: Renesas Electronics Corporation, Kanagawa (JP)

(72) Inventors: Ryo Kanda, Kanagawa (JP); Tetsu Toda, Kanagawa (JP); Yasushi Nakahara, Kanagawa (JP); Yoshinori Kaya, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/714,111

(22) Filed: May 15, 2015

(65) Prior Publication Data

US 2015/0262990 A1 Sep. 17, 2015

Related U.S. Application Data

(63) Continuation of application No. 14/325,003, filed on Jul. 7, 2014, now Pat. No. 9,048,213.

(30) Foreign Application Priority Data

Jul. 8, 2013 (JP) .................................. 2013-142924

(51) Int. Cl.

| H01L 29/739 | (2006.01) |
| H01L 29/76 | (2006.01) |
| H01L 29/78 | (2006.01) |
| H01L 27/02 | (2006.01) |
| H01L 29/40 | (2006.01) |
| H01L 29/10 | (2006.01) |
| H01L 29/06 | (2006.01) |

(52) U.S. Cl.

CPC ........ *H01L 27/0207* (2013.01); *H01L 29/0653* (2013.01); *H01L 29/1095* (2013.01); *H01L 29/402* (2013.01); *H01L 29/404* (2013.01); *H01L 29/7816* (2013.01)

(58) Field of Classification Search

CPC . H01L 27/0207; H01L 29/402; H01L 29/404; H01L 29/0653; H01L 29/7393; H01L 29/7816; H01L 29/1095

USPC .......... 257/76, 140, 144, 342, 344, 367, 409, 257/500, E29.197, E29.256, E21.409; 438/135, 197, 530

See application file for complete search history.

(56) References Cited

U.S. PATENT DOCUMENTS 7,183,626 B2   2/2007 Ranjan
7,709,908 B2 * 5/2010 Su et al. ........................ 257/409

(Continued)

FOREIGN PATENT DOCUMENTS

JP    2008-521256 A    6/2008
WO   2012/157223 A1   11/2012

OTHER PUBLICATIONS

Notice of Allowance U.S. Appl. No. 14/325,003 dated Feb. 4, 2015.

*Primary Examiner* — Dao H Nguyen

(74) *Attorney, Agent, or Firm* — McDermott Will & Emery LLP

(57) ABSTRACT

A field plate electrode is repetitively disposed in a folded manner or a spiral shape in a direction along an edge of a first circuit region. A coupling transistor couples a first circuit to a second circuit lower in supply voltage than the first circuit. A second conductivity type region is disposed around the coupling transistor. A part of the field plate electrode partially overlaps with the second conductivity type region. The field plate electrode is electrically coupled to a drain electrode of the coupling transistor at a portion located on the first circuit region side from a center thereof in a width direction of the separation region. A ground potential or a power potential of the second circuit is applied to the field plate electrode at a portion located on the second conductivity type region side from the center.

9 Claims, 17 Drawing Sheets

(56) References Cited

U.S. PATENT DOCUMENTS

| | | |
|---|---|---|
| 9,048,213 B2 * | 6/2015 | Kanda et al. |
| 2004/0251499 A1 * | 12/2004 | Yamaguchi et al. .......... 257/343 |
| 2011/0186928 A1 * | 8/2011 | Ichikawa ...................... 257/344 |
| 2011/0291157 A1 * | 12/2011 | Takahashi et al. ............ 257/144 |
| 2014/0167171 A1 * | 6/2014 | Kaya et al. .................... 257/367 |
| 2014/0217466 A1 * | 8/2014 | Yamaji .......................... 257/140 |

* cited by examiner

SEMICONDUCTOR DEVICE

CROSS-REFERENCE TO RELATED APPLICATIONS

The subject application is a Continuation application of U.S. Ser. No. 14/325,003 filed Jul. 7, 2014, which claims priority to Japanese Patent Application No. 2013-142924 filed on Jul. 8, 2013. The subject matter of each is incorporated herein by reference in entirety.

BACKGROUND

The present invention relates to a semiconductor device, and for example, a technique applicable to a semiconductor device having two circuits different in power voltage from each other.

A control circuit that generates a control signal of a power control element is integrated into one of the semiconductor devices. In the semiconductor device of this type, a voltage to be applied to the power control element, that is, a supply voltage of a power to be controlled is higher than a supply voltage of the control circuit. For that reason, in order to input the control signal to the power control element, a second control circuit may be disposed between the control circuit and the power control element. The supply voltage of the second control circuit is generally equal to or lower than the supply voltage of the power control element, and higher than the supply voltage of the control circuit. In the semiconductor device of this type, a circuit higher in the supply voltage needs to be separated from a circuit lower in the supply voltage.

As a separation structure that separates two circuits from each other, there are techniques disclosed in, for example, Japanese Unexamined Patent Application Publication (Translation of PCT Application) No. 2008-521256 and International Publication No. WO2012/157223.

For example, in the separation structure of Japanese Unexamined Patent Application Publication (Translation of PCT Application) No. 2008-521256, an active region having a power IGBT (insulated gate bipolar transistor) is surrounded by a spiral field plate. The field plate disclosed in Japanese Unexamined Patent Application Publication (Translation of PCT Application) No. 2008-521256 forms a closed loop on at least an outside end thereof.

Also, the separation structure disclosed in International Publication No. WO2012/157223 separates an anode region and a cathode region from each other. In this separation structure, a plurality of field plates separated from each other is arranged around the cathode region. The outermost peripheral field plate is coupled to the anode region, and the outermost peripheral field plate is coupled to the cathode region.

SUMMARY

The present inventors have studied that a transistor that couples two circuits different in power potential is disposed in a region where the separation structure is disposed, in order to transmit the control signal between the circuits different in the power potential from each other. In this situation, the present inventors have proposed that this transistor is surrounded by an impurity region in order to separate this transistor from other circuits. However, the present inventors have found that, in this structure, a portion of the field plate electrode which overlaps with the impurity region functions as a gate of a parasitic MOS transistor. In this case, a leak current of the transistor increases. The other problems and novel features will become from the description of the present specification and the attached drawings.

According to an aspect of the invention, a first circuit region having a first circuit is surrounded by a separation region. The separation region has a field plate electrode disposed on an element separation film. The field plate electrode is repetitively disposed in a folded manner or a spiral shape in a direction along an edge of the first circuit region. Also, a coupling transistor couples a first circuit to a second circuit lower in supply voltage than the first circuit. A second conductivity type region is disposed around the coupling transistor. A part of the field plate electrode overlaps with a part of the second conductivity type region. The field plate electrode is electrically coupled to a drain electrode of the coupling transistor at a portion located on the first circuit region side from a center portion thereof in a width direction of the separation region. A ground potential or a power potential of the second circuit is applied to the field plate electrode at a portion located on the second circuit region side from the center.

According to the aspect of the invention, an increase in a leak current of the transistor can be suppressed.

DETAILED DESCRIPTION

Hereinafter, embodiments will be described with reference to the accompanying drawings. In all of the drawings, the same components are denoted by like symbols, and a description thereof will be appropriately omitted.

First Embodiment

Figure 1:
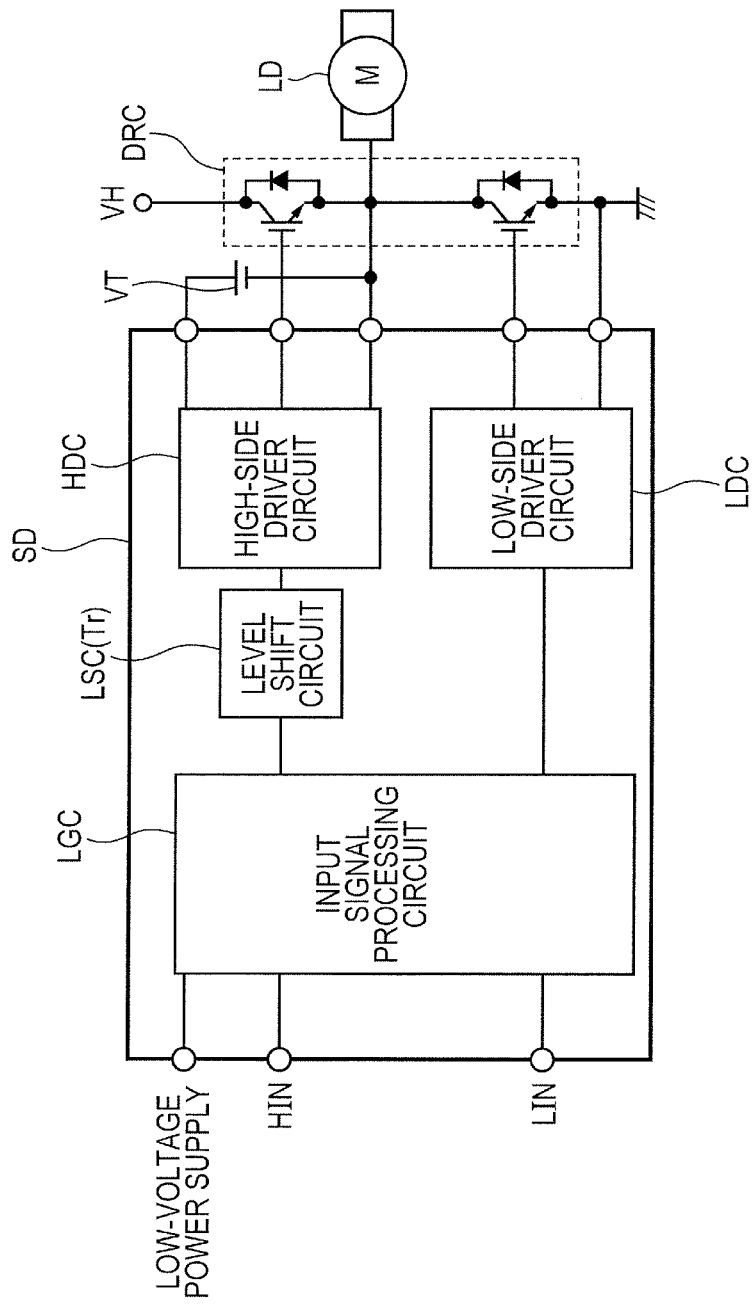
FIG. 1 is a functional block diagram of an electric device using a semiconductor device according to a first embodiment.

FIG. 1 is a functional block diagram of an electric device using a semiconductor device SD according to a first embodiment. The semiconductor device SD according to this embodiment is a device for supplying a control signal to a power control circuit DRC. The power control circuit DRC controls an electric power to be input to a load LD, for example, a motor. That is, the semiconductor device SD controls the load LD through the power control circuit DRC. The power control circuit DRC has, for example, a plurality of planar high-withstand MOS transistors, vertical MOS transistors, bipolar transistors, or IGBTs (insulated gate bipolar transistors).

The semiconductor device SD has a control circuit LGC (second circuit), a level shift circuit LSC, a high-side driver circuit HDC (first circuit), and a low-side driver circuit LDC. The control circuit LGC is a logic circuit, and generates control signals for controlling the load LD according to signals inputted from an external. The control signals include a signal for controlling the low-side driver circuit LDC, and the high-side driver circuit HDC. A voltage (first voltage) is applied to the high-side driver circuit HDC from a power supply VT.

A supply voltage of the low-side driver circuit LDC is substantially the same as a supply voltage of the control circuit LGC, and a difference between those supply voltages is small. For that reason, the control circuit LGC is coupled to the low-side driver circuit LDC not through the level shift circuit. On the other hand, a supply voltage (first voltage) of the high-side driver circuit HDC is larger than the supply voltage (second voltage) of the control circuit LGC. For that reason, the control circuit LGC is coupled to the high-side driver circuit HDC through the level shift circuit LSC. The level shift circuit LSC includes a coupling transistor TR which will be described later.

Figure 2:
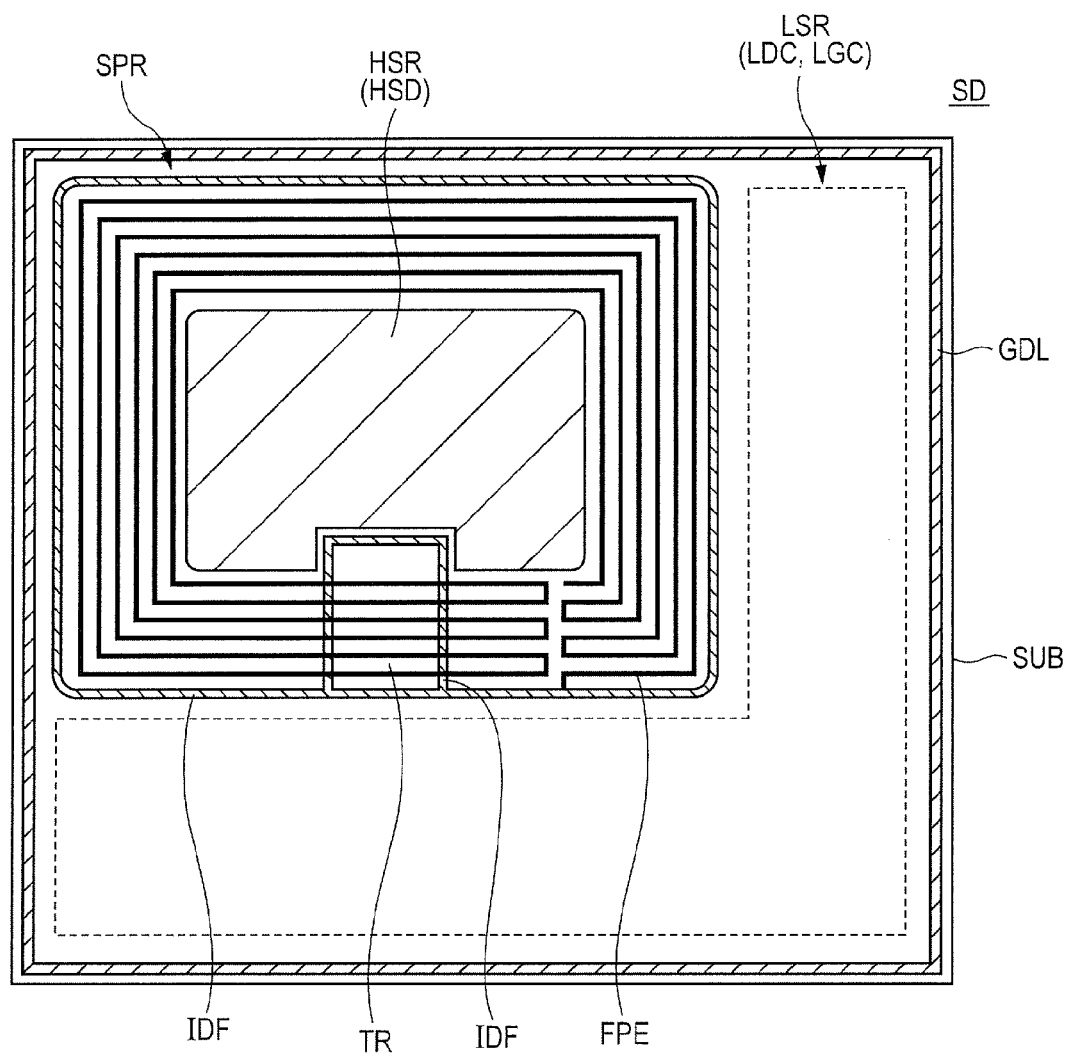
FIG. 2 is a plan view illustrating a configuration of the semiconductor device.

FIG. 2 is a plan view illustrating a configuration of the semiconductor device SD. The semiconductor device SD has a first circuit region HSR, a separation region SPR, a second circuit region LSR, and a coupling transistor TR inside of a region surrounded by a guard ring GDL.

The first circuit region HSR has the high-side driver circuit HDC, and the second circuit region LSR has the low-side driver circuit LDC and the control circuit LGC. The supply voltage of the low-side driver circuit LDC and the supply voltage (second voltage) of the control circuit LGC are lower than the supply voltage (first voltage) of the first circuit region HSR.

The first circuit region HSR is surrounded by the separation region SPR. That is, the first circuit region HSR and the second circuit region LSR are separated from each other by the separation region SPR. With this configuration, the circuits each having a difference supply potential can be formed on one substrate SUB.

In the example shown in this drawing, each of the substrate SUB and the first circuit region HSR is substantially rectangular. The first circuit region HSR is arranged close to one corner of the substrate SUB. No other circuit is arranged between one long side (upper side in the example shown in the figure) and one short side (left side in the example shown in the figure) of the first circuit region HSR, and sides of the substrate SUB closest to those sides of the first circuit region HSR.

The coupling transistor TR is located in the separation region SPR, and the control circuit LGC is coupled to the high-side driver circuit HDC. Specifically, the control circuit LGC is coupled to a gate electrode GE (to be described later) of the coupling transistor TR, and the high-side driver circuit HDC is coupled to a drain DR of the coupling transistor TR.

In this example, it is assumed that the conductivity types of the drain and the source of the coupling transistor TR are a first conductivity type (for example, n-type). Also, a portion of the substrate SUB which is located in the separation region SPR, and portions of the substrate SUB which are located in the first circuit region HSR and the second circuit region LSR are also of the first conductivity type.

Figure 3:
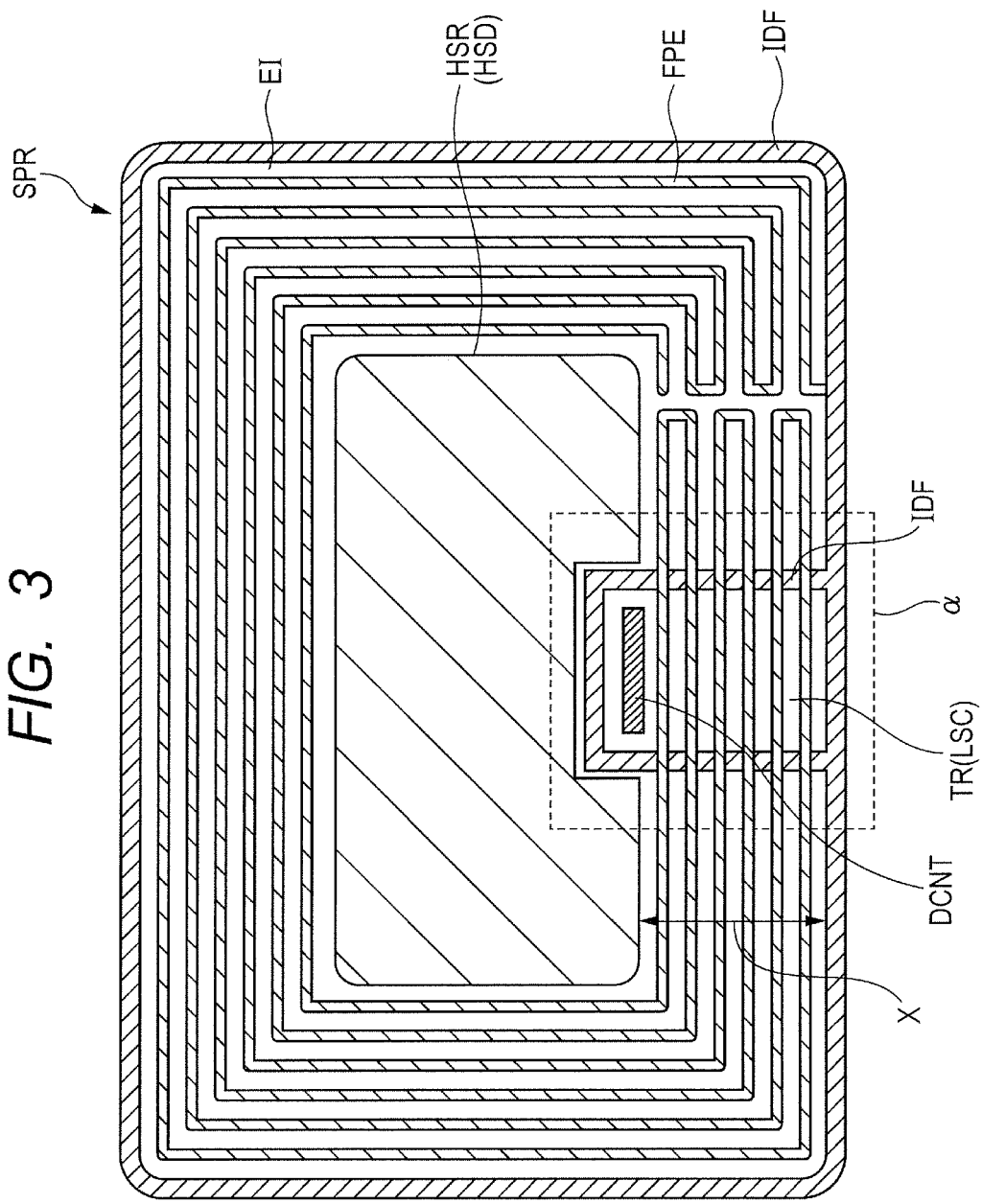
FIG. 3 is a plan view illustrating configurations of a separation region and a coupling transistor.

FIG. 3 is a plan view illustrating configurations of the separation region SPR and the coupling transistor TR. As described above, the separation region SPR surrounds the first circuit region HSR. The separation region SPR has an element separation film EI and a field plate electrode FPE.

The element separation film EI surrounds the first circuit region HSR. The element separation film EI is formed through, for example, an LOCOS oxidation method. However, the element separation film EI may be formed through an STI technique.

The field plate electrode FPE overlaps with the element separation film EI in a plan view, and is repetitively disposed in a folded manner in a direction along an edge of the first circuit region HSR. In the example shown in this figure, a second conductivity type region IDF is arrayed substantially at a regular interval. The field plate electrode FPE surrounds the first circuit region HSR except for a neighborhood of turn points. The field plate electrode FPE is a resistive field plate electrode, and electrically coupled to a drain electrode DRE of the coupling transistor TR at a portion located at the first circuit region HSR side from a center of the separation region SPR in a width direction X thereof. Also, a ground potential or a power potential of the control circuit LGC (second circuit) is applied to the field plate electrode FPE at a portion located at the second circuit region LSR side from the center thereof. In the following description, the ground potential is applied to the field plate electrode FPE.

It is preferable that the field plate electrode FPE is coupled to the drain electrode DRE of the coupling transistor TR in the innermost periphery (a side closer to the first circuit region HSR). Also, it is preferable that the ground potential is applied to the field plate electrode FPE in the outermost periphery (a side closer to the second circuit region LSR). With the above configuration, when viewed in an extension direction of the field plate electrode FPE, most of the field plate electrode FPE can provide a potential gradient, as a result of which the effect of suppressing electrolysis concentration caused by the field plate electrode FPE becomes large.

Also, the coupling transistor TR is disposed between one long side of the first circuit region HSR and the second circuit region LSR. The coupling transistor TR is surrounded by the second conductivity type region IDF. The second conductivity type region IDF is a region in which impurities of the second conductivity type (for example, p-type) are introduced into the substrate SUB, and the coupling transistor TR is separated from the other regions. The second conductivity type region IDF is also disposed in the outermost periphery of the separation region SPR so as to surround the field plate electrode FPE. The element separation film EI is formed on the second conductivity type region IDF except for a partial portion.

Figure 4:
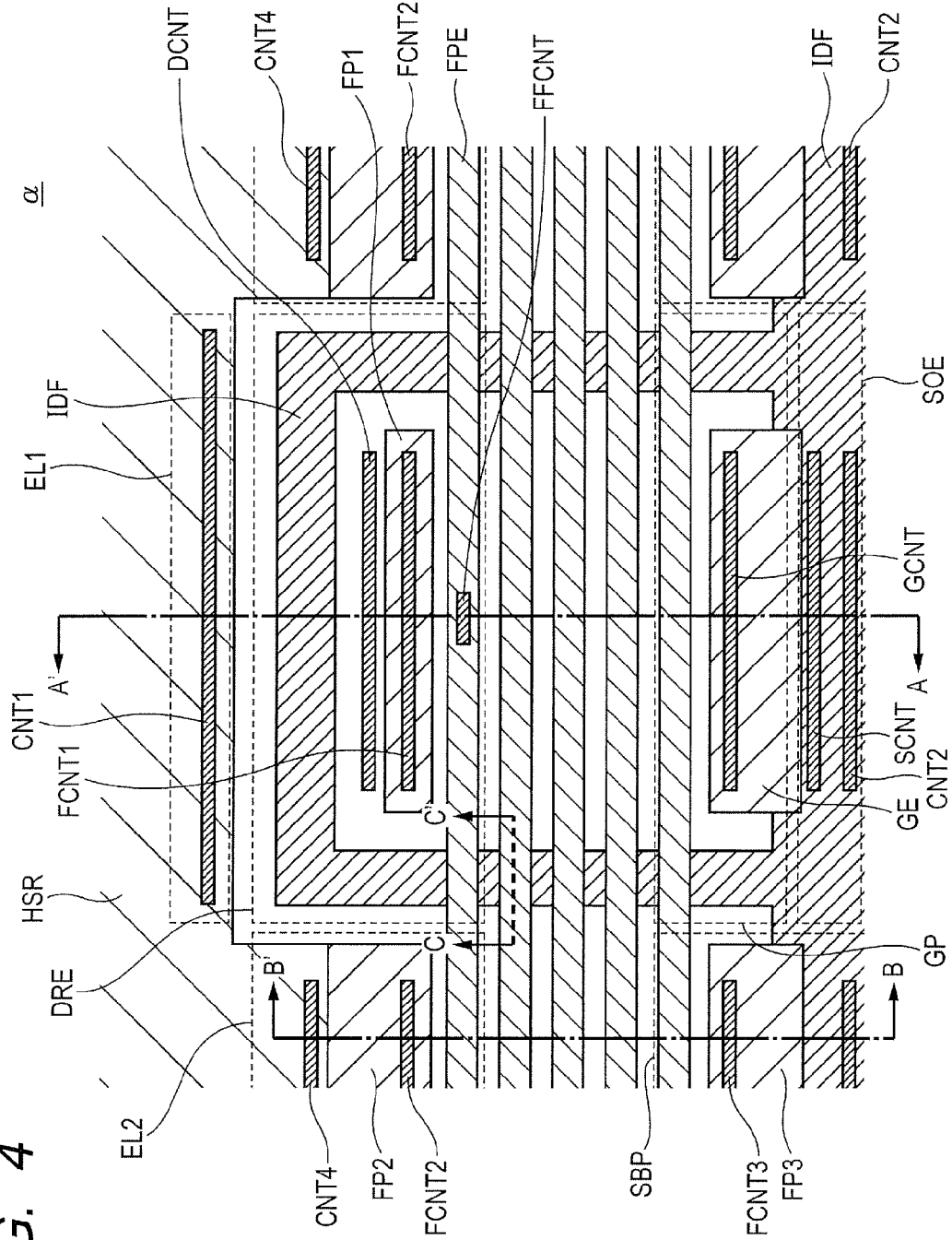
FIG. 4 is an enlarged view of a region surrounded by a dotted line α in FIG. 3.
Figure 5:
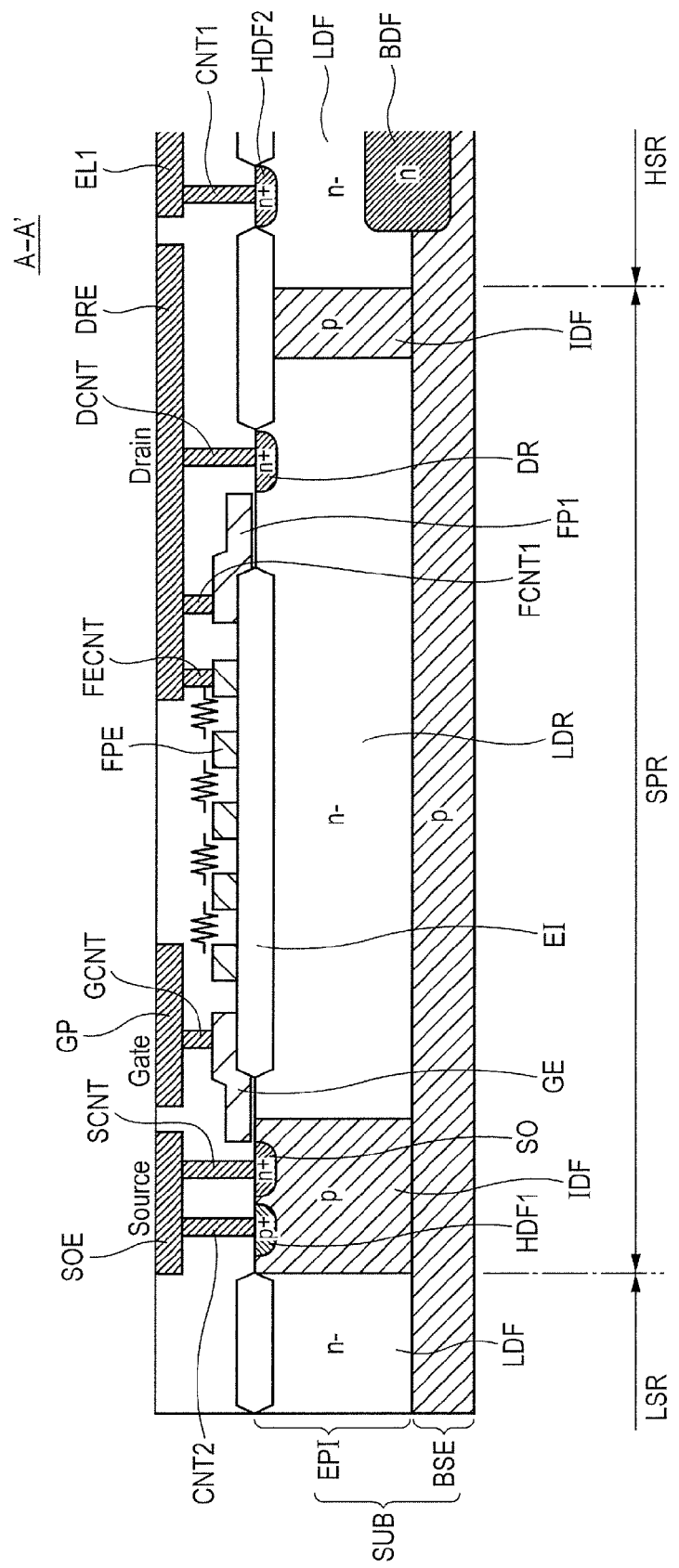
FIG. 5 is a cross-sectional view taken along a line A-A' in FIG. 4.

FIG. 4 is an enlarged view of a region surrounded by a dotted line α in FIG. 3, which is a plan view illustrating configurations of the coupling transistor TR, and a periphery thereof. FIG. 5 is a cross-sectional view taken along a line A-A' in FIG. 4. Referring to FIG. 4, the element separation film EI is omitted from illustration.

In the example shown in the figure, the substrate SUB is formed by allowing a semiconductor layer EPI (for example, silicon layer) of the first conductivity type (for example, n$^-$-type) to epitaxially grow on a substrate BSE (for example, silicon substrate) of the second conductivity type (for example, p-type) which forms a base. Also, a first conductivity type (for example, n-type) embedded diffusion layer BDF is formed in a region of the first circuit region HSR in the substrate SUB. The embedded diffusion layer BDF is extended from an upper portion of the substrate BSE to a bottom of the semiconductor layer EPI in a thickness direction of the substrate SUB.

As described above, the coupling transistor TR is surrounded by the second conductivity type region IDF. As illustrated in FIG. 5, the second conductivity type region IDF is formed on the overall semiconductor layer EPI in the thickness direction. For that reason, a lower end of the second conductivity type region IDF is coupled to the substrate SUB.

Also, as illustrated in FIG. 5, a source SO of the first conductivity type, a gate electrode GE, and the drain DR of the first conductivity type are arrayed in a direction (for example, a direction orthogonal thereto) crossing the edge of the first circuit region HSR. Specifically, the drain DR, the gate electrode GE, and the source SO are arrayed in the stated order from the first circuit region HSR toward the second circuit region LSR.

In the example illustrated in FIG. 5, the coupling transistor TR is a drain offset type transistor, and formed with the use of the semiconductor layer EPI.

In detail, the element separation film EI is formed between the drain DR and the gate electrode GE. The gate electrode GE is partially located on the element separation film EI. Also, the source SO is formed in a portion of the second conductivity type region IDF, which is located in an outer periphery of the separation region SPR. A portion (that is, a portion located been the drain DR and the gate electrode GE in a plan view) of the semiconductor layer EPI, which is located under the element separation film EI) forms a drift region LDR of the first conductivity type (for example, n$^-$-type).

Also, the field plate electrode FPE is formed on the element separation film EI between the gate electrode GE and the drain DR. An edge of the element separation film EI on the DR side is covered with a field plate electrode FP1. All of the gate electrode GE, the field plate electrode FPE, and the field plate electrode FP1 are formed in the same process. For that reason, those components are made of the same material (for example, polysilicon). However, at least one of the gate electrode GE, the field plate electrode FPE, and the field plate electrode FP1 may be formed in a different process from the other.

As illustrated in FIGS. 4 and 5, the drain electrode DRE, a source electrode SOE, and a gate plate electrode GP are formed above the substrate SUB. At least one layer of interlayer insulating film is formed between those electrodes and the substrate SUB. Also, those electrodes are made of metal such as Al, and formed in the same process.

The drain electrode DRE is coupled to the drain DR through a contact DCNT, coupled to the field plate electrode FP1 through a contact FCNT1, and coupled to the field plate electrode FPE through a contact FECNT. In the example shown in the figure, the contact FECNT is coupled to an innermost periphery (first circuit region HSR side) of the field plate electrode FPE.

The gate plate electrode GP is coupled to the gate electrode GE through a contact GCNT. The source electrode SOE is coupled to the source SO through a contact SCNT. Also, the source electrode SOE is coupled to a high-concentration layer HDF1 of the second conductivity type formed in the second conductivity type region IDF through a contact CNT2. With the above configuration, a source potential (for example, ground potential) is applied to the second conductivity type region IDF.

An electrode EL1 is also formed in the same layer as the drain electrode DRE. The electrode EL1 is coupled to a high-concentration layer HDF2 of the second conductivity type located in the first circuit region HSR through a contact CNT1. With the above configuration, the power potential of the first circuit region HSR is applied to a first conductivity type layer LDF (semiconductor layer EPI) located in the first circuit region HSR through the electrode EL1.

Figure 6:
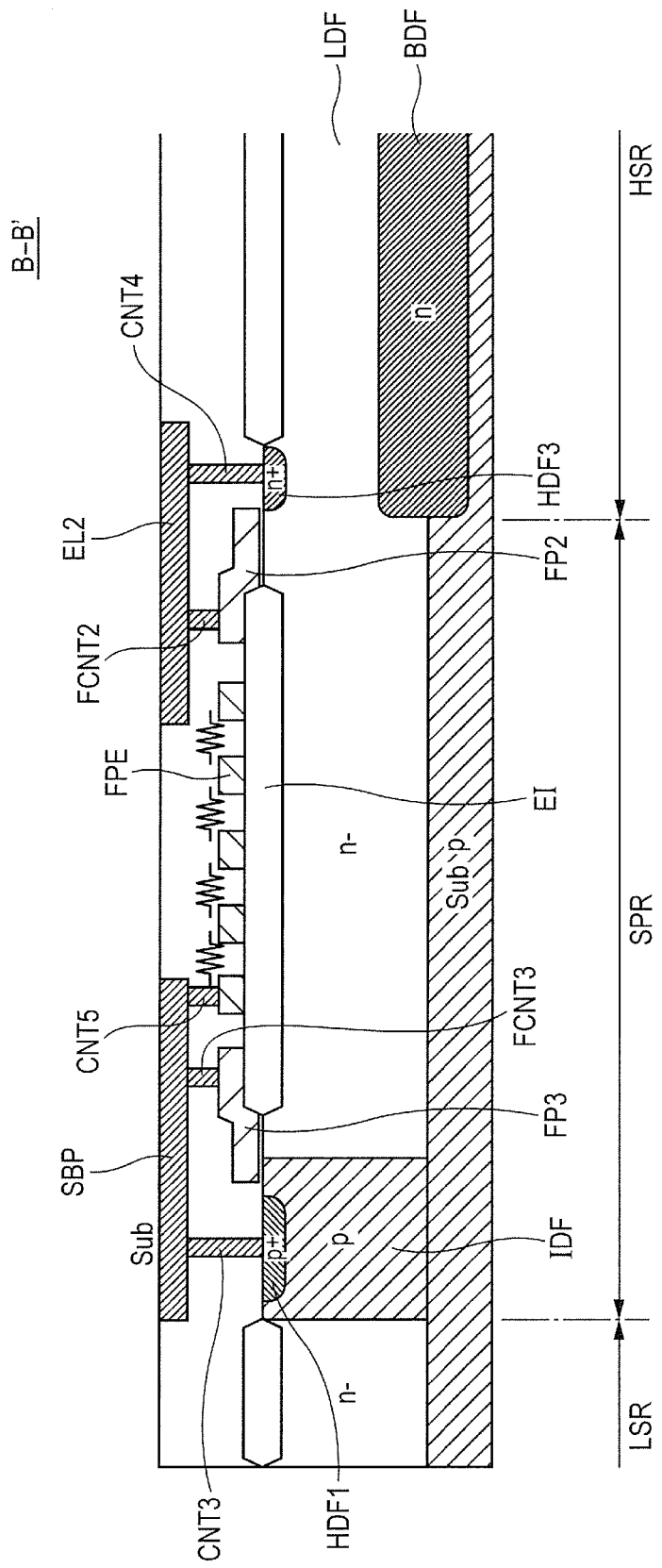
FIG. 6 is a cross-sectional view taken along a line B-B' in FIG. 4.

FIG. 6 is a cross-sectional view taken along a line B-B' in FIG. 4. As illustrated in this figure and FIG. 4, the field plate electrode FPE as well as field plate electrodes FP2 and FP3 are formed in a region of the separation region SPR in which the coupling transistor TR is not formed. The field plate electrodes FP2 and FP3 have the same configuration as that of the field plate electrode FP1 illustrated in FIG. 5. That is, the field plate electrode FP2 covers an edge of the element separation film EI on the first circuit region HSR side, and the field plate electrode FP3 covers an edge of the element separation film EI on the second circuit region LSR side.

The field plate electrode FP2 is coupled to an electrode EL2 through a contact FCNT2, and the field plate electrode FP3 is coupled to an electrode SBP through a contact FCNT3. Both of the electrodes EL2 and SBP are located in the same layer as that of the drain electrode DRE illustrated in FIG. 5, and formed in the same process as that of the drain electrode DRE.

The ground potential is applied to the source electrode SOE and the electrode SBP. Also, the electrode SBP is coupled to the field plate electrode FPE through a contact CNT5. In the example shown in the figure, the contact CNT5 is coupled to a periphery of the field plate electrode FPE closest to the second circuit region LSR side (outermost side).

Further, the electrode EL2 is coupled to a high-concentration layer HDF3 of the first conductivity type through a contact CNT4, and the electrode SBP is coupled to the high-concentration layer HDF1 of the second conductivity type through a contact CNT3. Also, the high-concentration layer HDF3 is disposed on a front surface of the first conductivity type layer LDF located in the first circuit region HSR.

Figure 7:
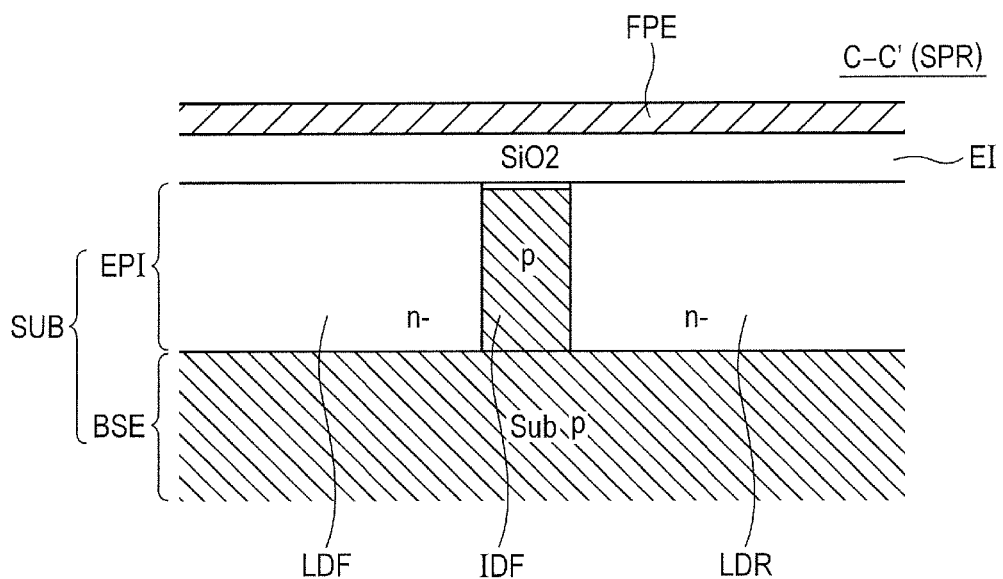
FIG. 7 is a cross-sectional view taken along a line C-C' in FIG. 4.

Subsequently, the actions and advantages of this embodiment will be described. FIG. 7 is a cross-sectional view taken along a line C-C' in FIG. 4. As illustrated in this figure and FIG. 4, a part of the field plate electrode FPE overlaps with a part of the second conductivity type region IDF through the element separation film EI. In a portion that overlaps with the field plate electrode FPE, the semiconductor layer EPI located in the separation region SPR, that is, the first conductivity type layer LDF is located on a side to the drift region LDR through the second conductivity type region IDF. In the above configuration, the field plate electrode FPE, the element separation film EI, the second conductivity type region IDF, the first conductivity type layer LDF, and the drift region LDR configure a parasitic MOS transistor. Specifically, the field plate electrode FPE functions as a gate electrode, the element separation film EI functions as a gate insulating film, and the second conductivity type region IDF functions as a channel region. Also, because the first conductivity type layer LDF is higher in potential than the drift region LDR, the first conductivity type layer LDF functions as a drain, and the drift region LDR functions as a source. When the parasitic MOS transistor operates, a current is leaked from the drift region LDR to the first conductivity type layer LDF. That is, a separation function of the separation region SPR is degraded.

On the contrary, in this embodiment, a potential of the field plate electrode FPE on the higher potential side is identical with the potential of the drain DR. Also, within the semiconductor layer EPI, the drift region LDR is coupled to the drain DR. For that reason, a difference between the potential of the field plate electrode FPE and the potential of the drift region LDR becomes small. Therefore, the above-mentioned parasitic MOS transistor can be prevented from turning on.

In this embodiment, the field plate electrode FPE repetitively crosses the second conductivity type region IDF, a plurality of the above parasitic MOS transistors are formed. The potential of the drift region LDR is gradually more decreased with more increasing a distance from the drain DR. Therefore, the above-mentioned advantages are obtained even in any parasitic MOS transistors.

The potential of the field plate electrode FPE on the higher potential side is lower than the power potential of the first circuit region HSR. For that reason, a potential gradient of the first conductivity type layer LDF located below the element separation film EI is liable to be steepest between a portion contacting with the first circuit region HSR, and a region located below the field plate electrode FPE in the innermost peripheral side.

Figure 8:
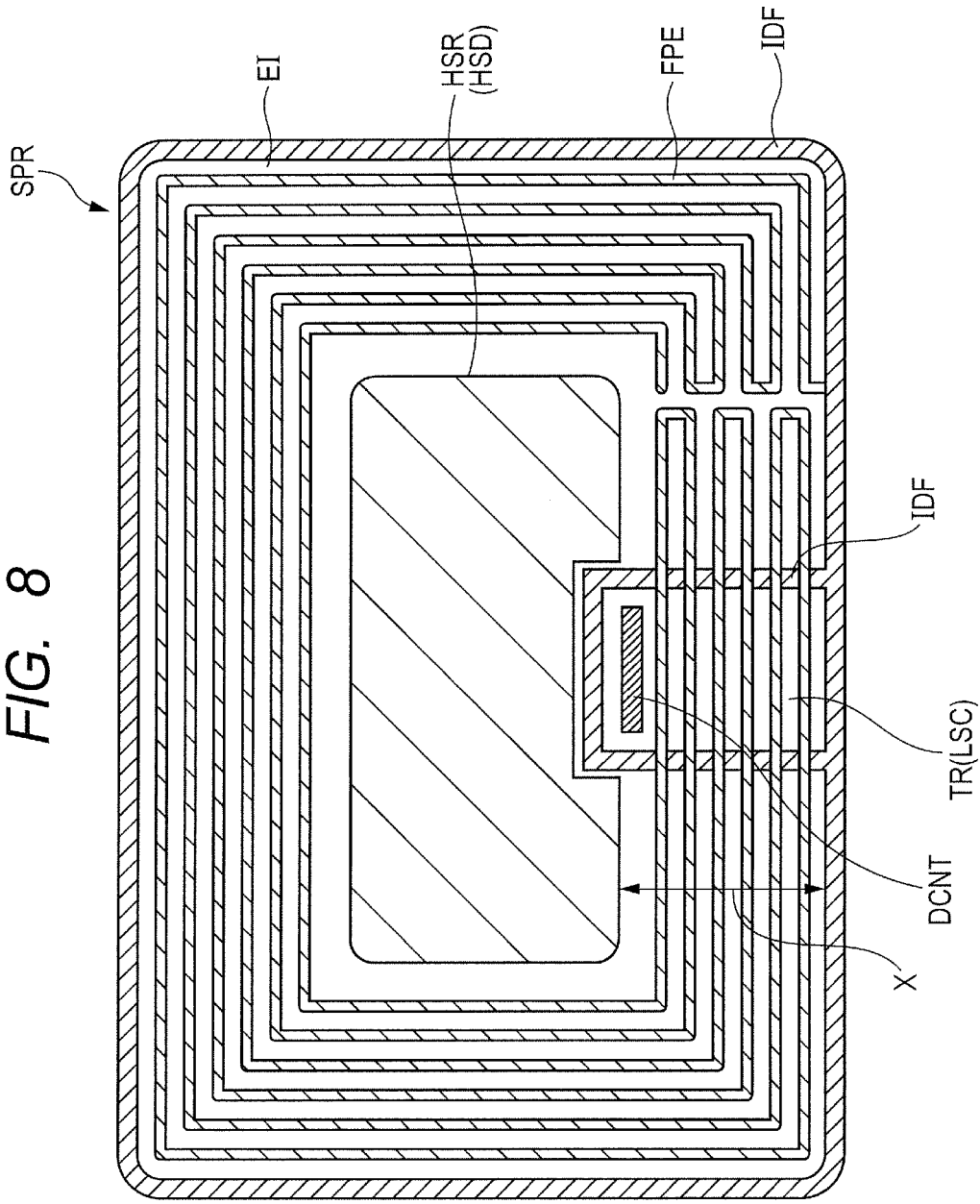
FIG. 8 is a plan view illustrating a modification of FIG. 3.

On the contrary, as illustrated in FIG. 8, an interval between the edge of the first circuit region HSR and the field plate electrode FPE in the innermost peripheral side may be larger than an interval between the field plate electrode FPE in the innermost peripheral side and the field plate electrode FPE in a second innermost peripheral side thereof. With the above configuration, the potential gradient of the first conductivity type layer LDF located between a portion contacting with the first circuit region HSR, and a region located below the field plate electrode FPE in the innermost peripheral side can be made gentle.

Second Embodiment

Figure 9:
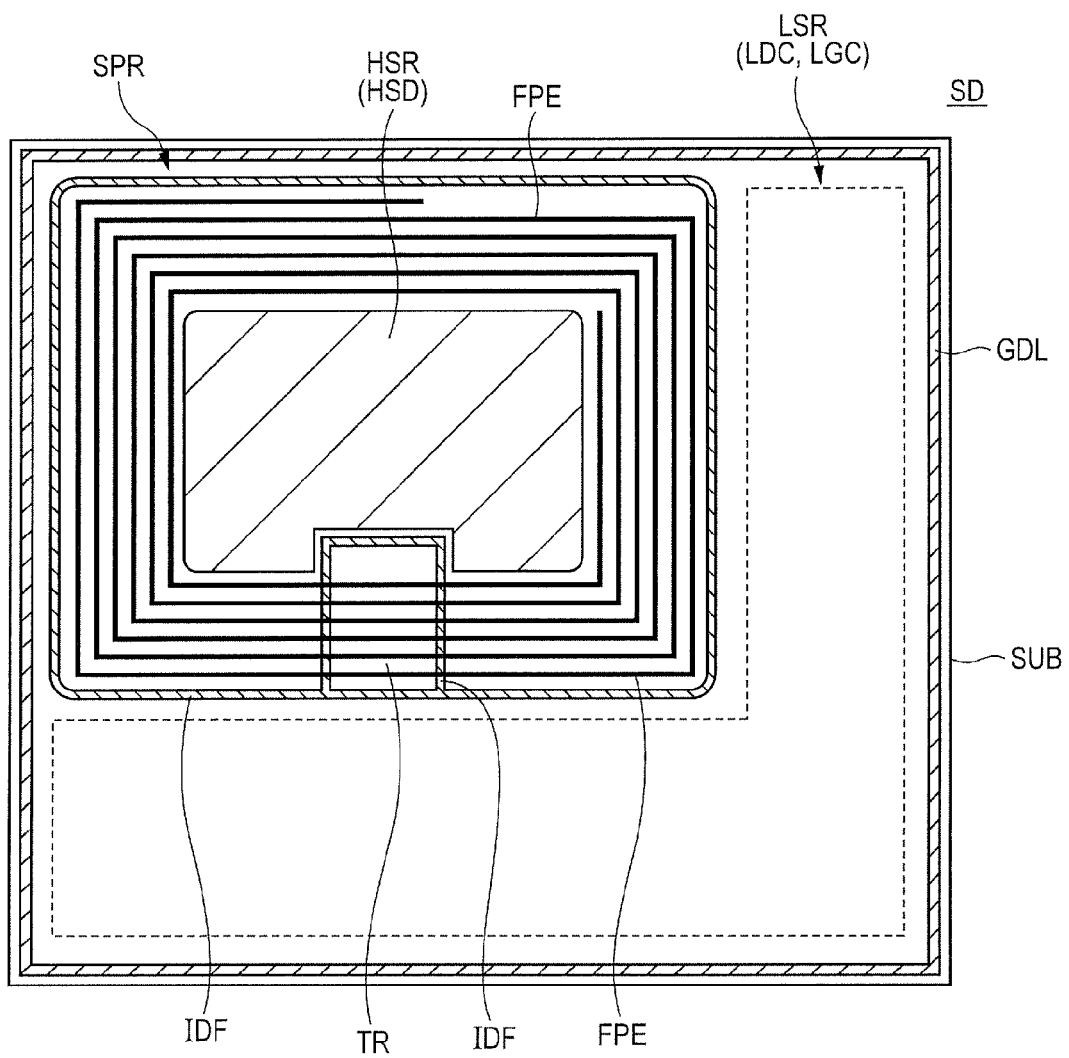
FIG. 9 is a diagram illustrating a configuration of a main portion of a semiconductor device according to a second embodiment.

FIG. 9 is a diagram illustrating a configuration of a main portion of a semiconductor device SD according to a second embodiment, which corresponds to FIG. 3 of the first embodiment. The semiconductor device SD according to this embodiment has the same configuration as that of the semiconductor device SD in the first embodiment except that the field plate electrode FPE repetitively surrounds the first circuit region HSR in the spiral shape.

The same advantages as those in the first embodiment are obtained even in this embodiment.

Third Embodiment

Figure 10:
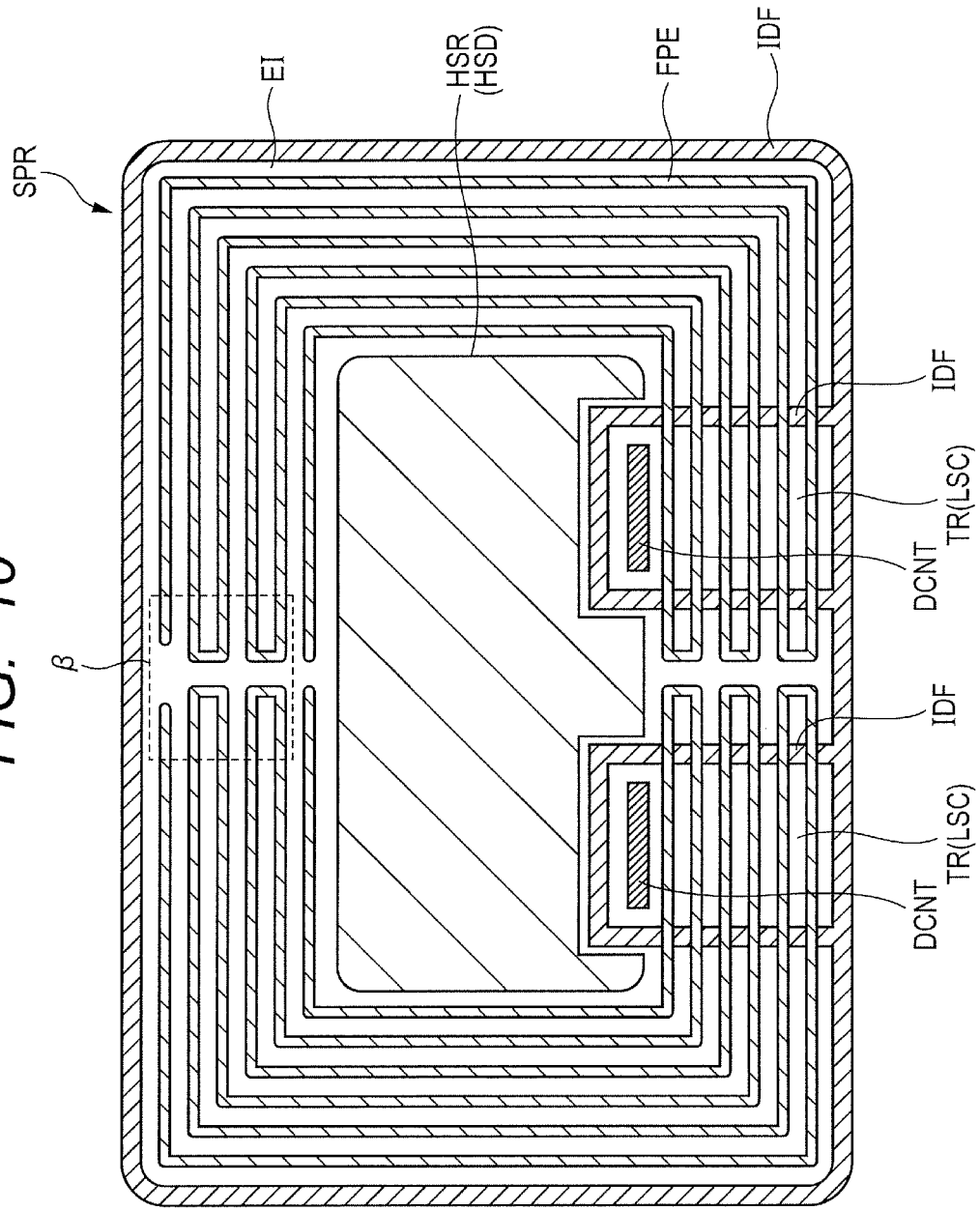
FIG. 10 is a diagram illustrating a main portion of a semiconductor device according to a third embodiment.

FIG. 10 is a diagram illustrating a main portion of a semiconductor device SD according to a third embodiment, which corresponds to FIG. 3 in the first embodiment. The semiconductor device SD according to this embodiment has the same configuration as that of the semiconductor device SD in the first embodiment except for the following configurations.

First, two coupling transistors TR are coupled to the separation region SPR. The two coupling transistors TR are spaced away from each other along the edge of the first circuit region HSR, and separated from each other by the second conductivity type region IDF. The field plate electrode FPE is disposed in each of the two coupling transistors TR, individually. The first circuit region HSR is surrounded by those two field plate electrodes FPE.

In other words, the separation region SPR can be separated into two virtual regions in an region between the two coupling transistors TR. The field plate electrode FPE is disposed in each overall region of two divided virtual regions.

In the example shown in the figure, both of the two coupling transistors TR are arranged along the identical side of the separation region SPR, specifically, along one of the long sides of the separation region SPR which faces the second circuit region LSR.

Figure 11:
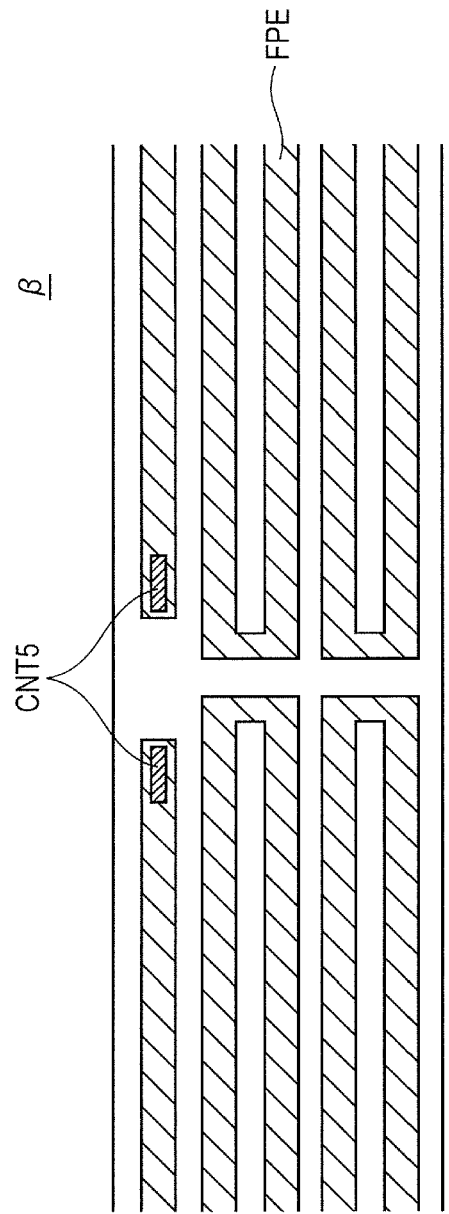
FIG. 11 is an enlarged view of a region surrounded by a dotted line β in FIG. 10.

FIG. 11 is an enlarged view of a region surrounded by a dotted line β in FIG. 10. Ends of one of the two field plate electrode FPE which is located on the outer peripheral side are separated from each other. The respective ends are coupled to the electrode SBP illustrated in FIG. 6 through the contact CNT5.

Figure 12:
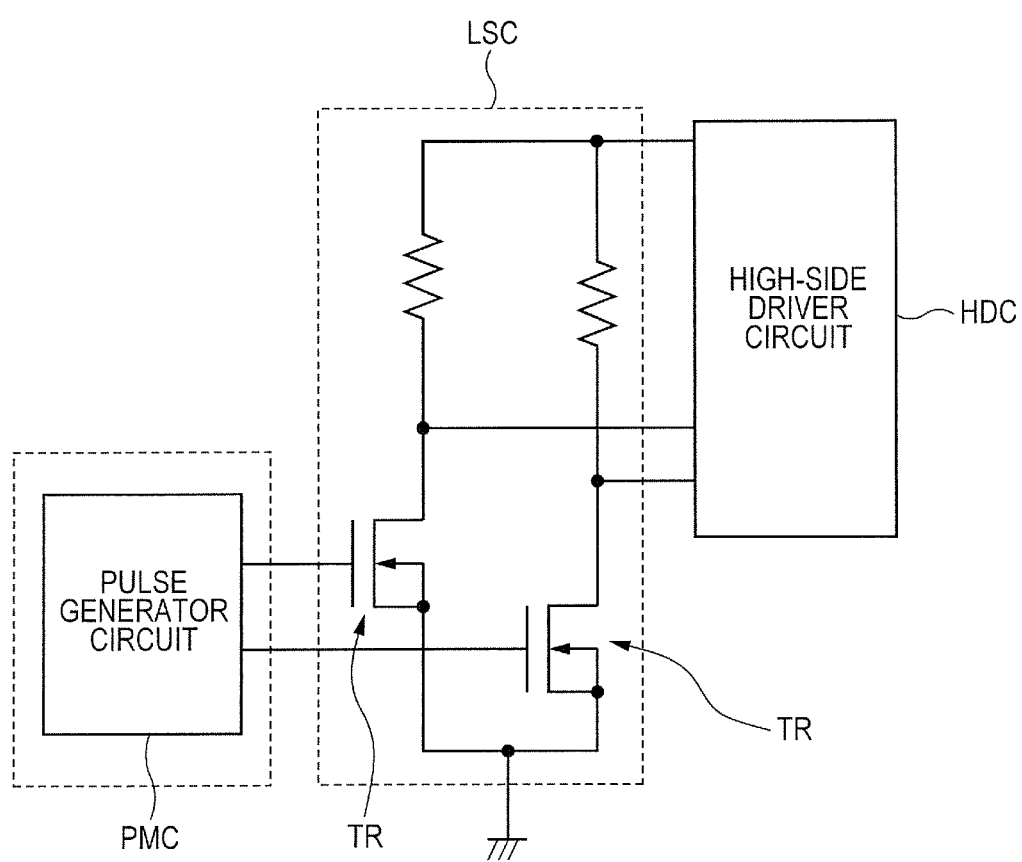
FIG. 12 is a circuit diagram of a level shift circuit.

FIG. 12 is a circuit diagram of a level shift circuit LSC according to this embodiment. The level shift circuit LSC is coupled with a pulse generator circuit PMC. The pulse generator circuit PMC is disposed, for example, in the second circuit region LSR. Alternatively, the pulse generator circuit PMC may be disposed outside of the semiconductor device SD. Two terminals of the pulse generator circuit PMC are coupled to the respective gate electrodes GE of the coupling transistors TR different from each other. A drain DR of a first coupling transistor TR is coupled to a first input terminal of the high-side driver circuit HDC, and a drain DR of a second coupling transistor TR is coupled to a second input terminal of the high-side driver circuit HDC. Also, the drain DR of any coupling transistor TR is coupled to a power wiring of the high-side driver circuit HDC through a resistor. A source SO of any coupling transistor TR is grounded.

This embodiment obtains the same advantages as those in the first embodiment.

Fourth Embodiment

Figure 13:
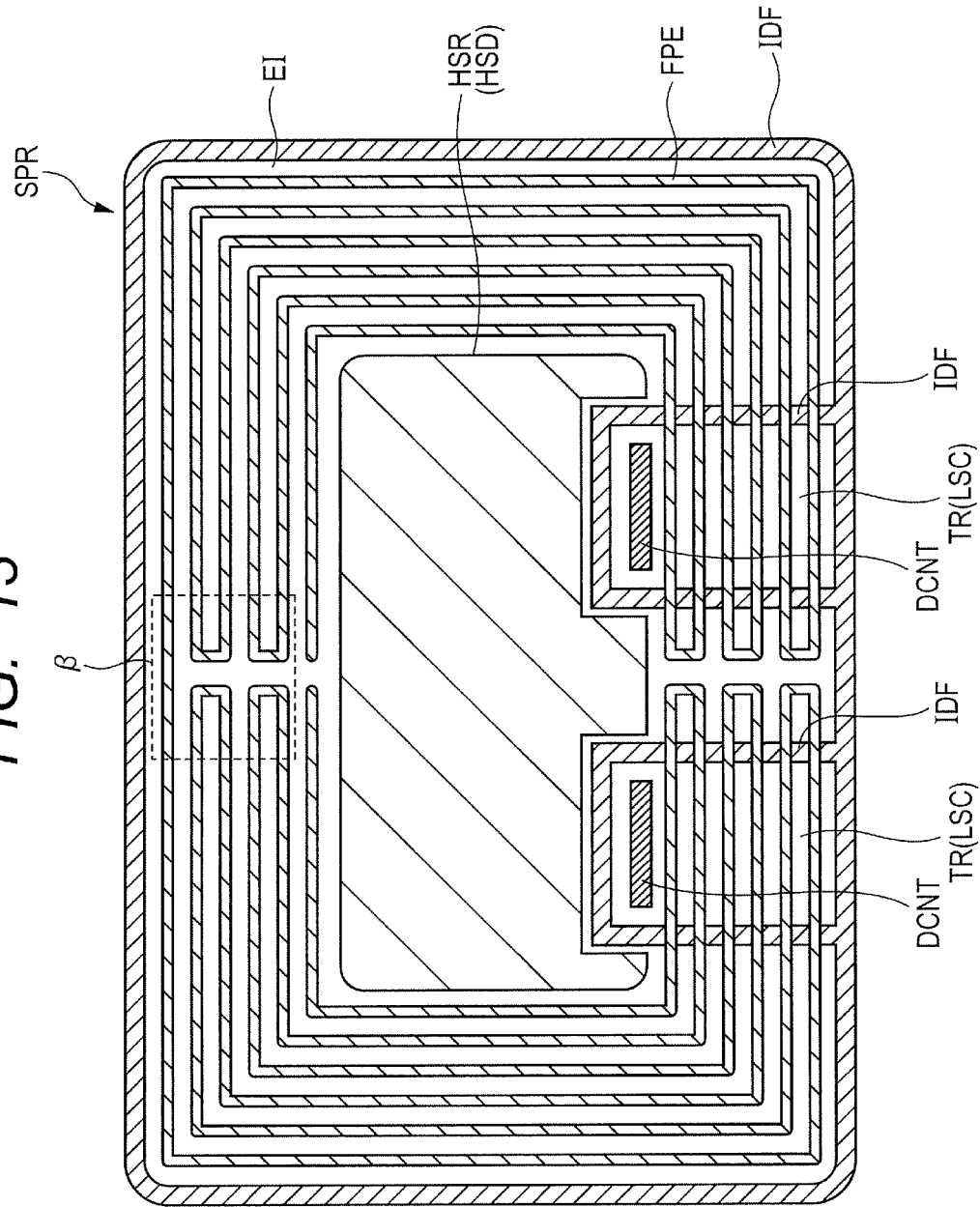
FIG. 13 is a diagram illustrating a configuration of a main portion of a semiconductor device according to a fourth embodiment.
Figure 14:
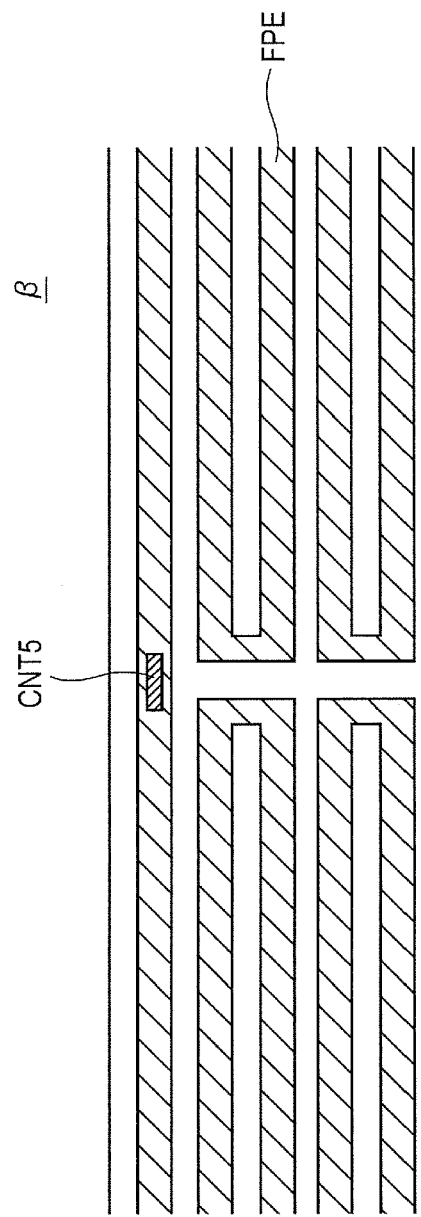
FIG. 14 is an enlarged view of a region surrounded by a dotted line β in FIG. 13.

FIG. 13 is a diagram illustrating a configuration of a main portion of a semiconductor device SD according to a fourth embodiment, which corresponds to FIG. 10 in the third embodiment. FIG. 14 is an enlarged view of a region surrounded by a dotted line β in FIG. 13. The semiconductor device SD according to this embodiment has the same configuration as that of the semiconductor device SD in the third embodiment except that the two field plate electrodes FPE are coupled to each other on ends opposite to the coupling transistor TR, that is, in the outermost periphery.

In other words, in this embodiment, one field plate electrode FPE is provided. The field plate electrode FPE has a center located on the outermost peripheral side of the separation region SPR, and approaches the inner peripheral side of the separation region SPR in a folded manner toward the ends thereof. The substantially center of the field plate electrode FPE is coupled to the contact CNT5. Also, one end side of the field plate electrode FPE is coupled to the drain electrode DRE of one coupling transistor TR, and the other end side of the field plate electrode FPE is coupled to the drain electrode DRE of the other coupling transistor TR.

This embodiment has the same advantages as those in the third embodiment. Also, because the contact CNT5 of the field plate electrode FPE on the low potential side can be disposed in one place, an application structure of the potential to the field plate electrode FPE can be simplified.

Fifth Embodiment

Figure 15:
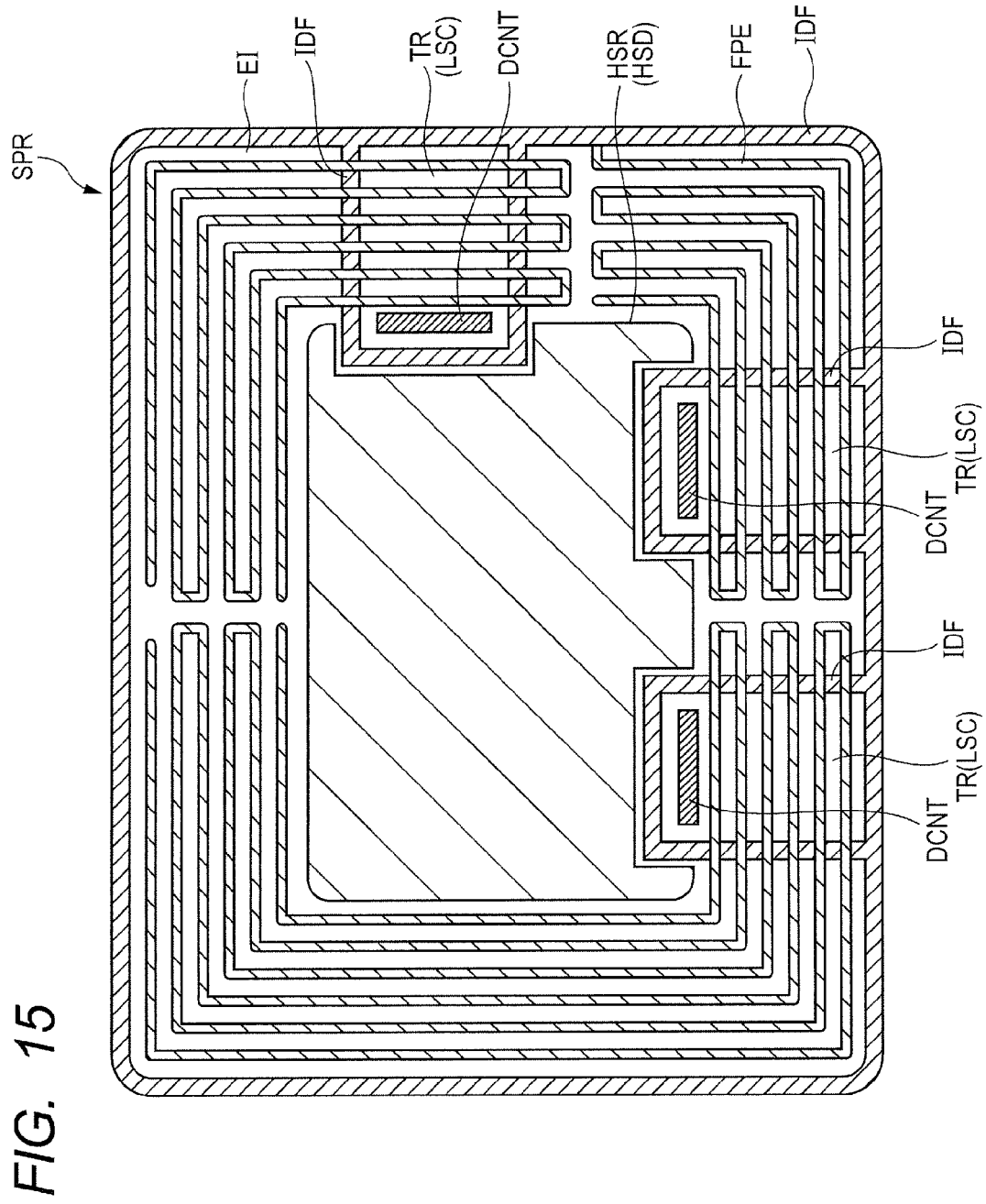
FIG. 15 is a diagram illustrating a configuration of a main portion of a semiconductor device according to a fifth embodiment.

FIG. 15 is a diagram illustrating a configuration of a main portion of a semiconductor device SD according to a fifth embodiment, which corresponds to FIG. 10 in the third embodiment. The semiconductor device SD according to this embodiment has the same configurations as those of the semiconductor device SD in the third embodiment except that three coupling transistors TR are provided.

Specifically, an arrangement of the two coupling transistors TR is identical with that in the third embodiment. The remaining one coupling transistor TR is disposed on one of the two short sides of the separation region SPR, which faces the second circuit region LSR. The field plate electrode FPE is disposed in each of the three coupling transistors TR.

Figure 16:
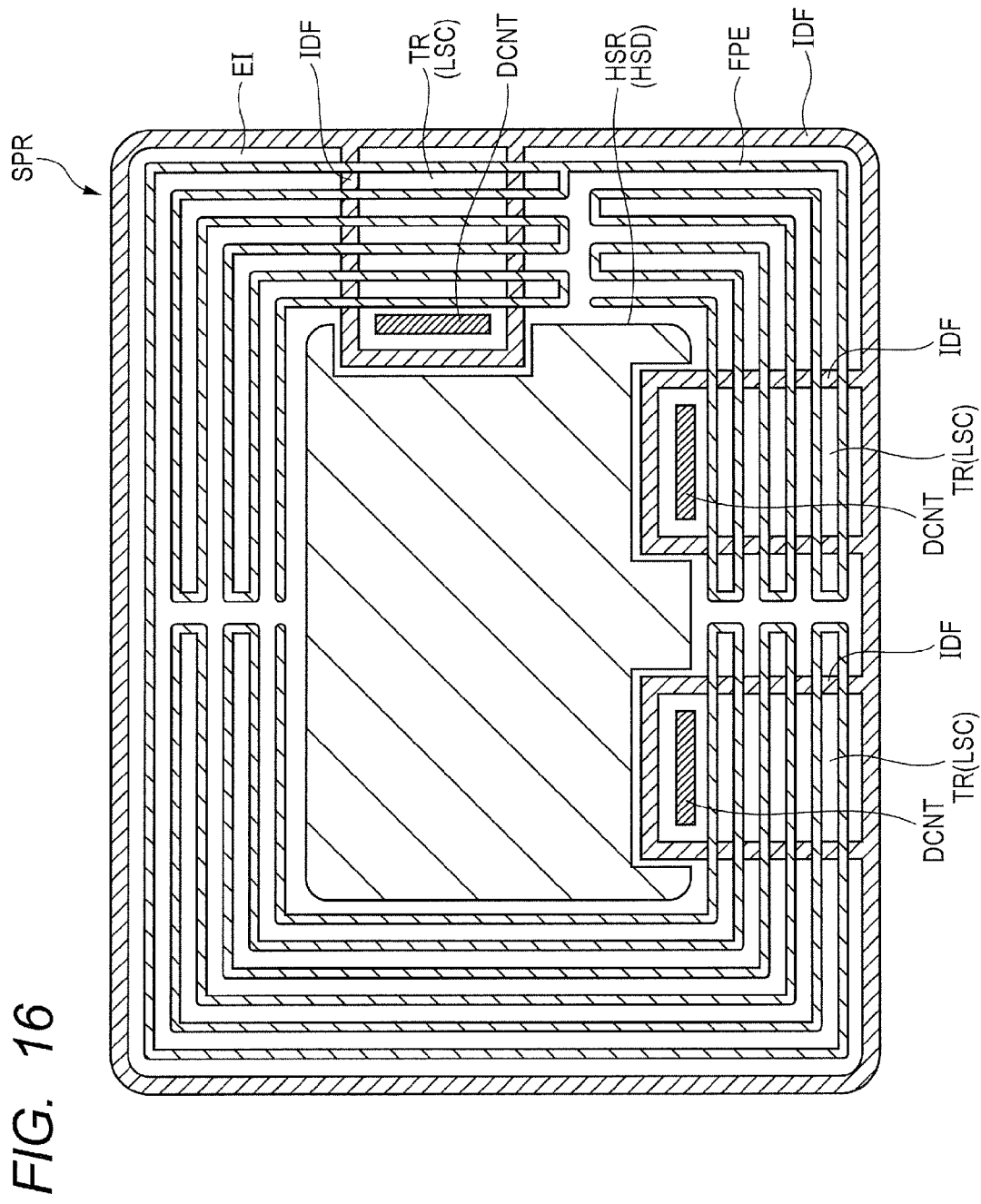
FIG. 16 is a diagram illustrating a modification of FIG. 15.

As illustrated in FIG. 16, the two field plate electrodes FPE each may have the same configuration as that of the field plate electrode FPE in the fourth embodiment. In other words, in FIG. 16, a common field plate electrode FPE is disposed on the two coupling transistors TR. The field plate electrode FPE located on the remaining one coupling transistor TR is also coupled to the above-mentioned common field plate electrode FPE in the outermost periphery.

This embodiment has the same advantages as those in the first embodiment.

Sixth Embodiment

Figure 17:
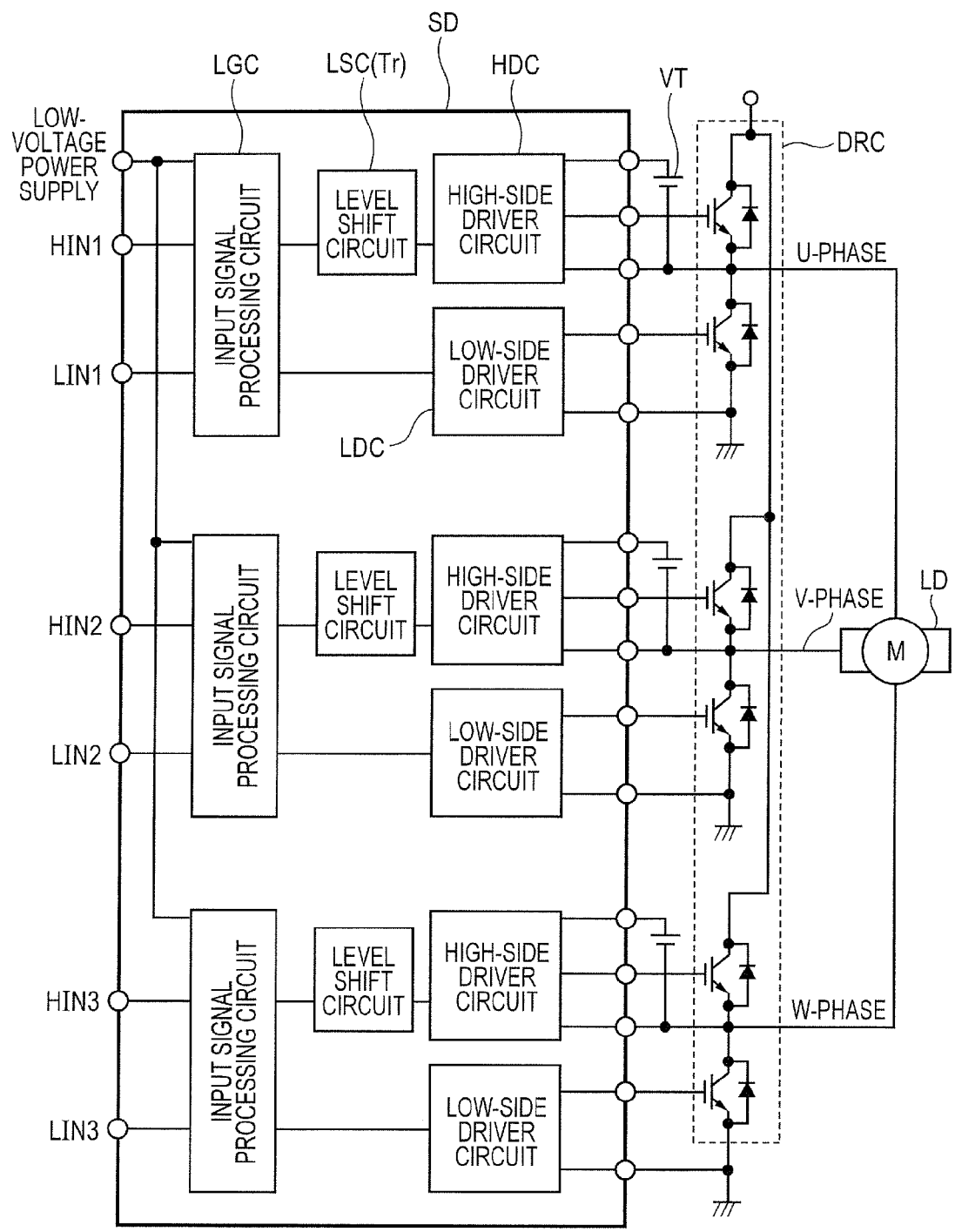
FIG. 17 is a functional block diagram of an electric device using a semiconductor device according to a sixth embodiment.

FIG. 17 is a functional block diagram of an electric device according to a sixth embodiment. The electric device according to this embodiment has a three-phase power supply of the load LD. The semiconductor device SD has the control circuit LGC, the level shift circuit LSC, the high-side driver circuit HDC, and the low-side driver circuit LDC illustrated in FIG. 1, for each of phases (U-phase, V-phase, W-phase). Also, the high-side driver circuit HDC and the low-side driver circuit LDC corresponding to the U-phase are coupled to the load LD through the first power control circuit DRC. The high-side driver circuit HDC and the low-side driver circuit LDC corresponding to the V-phase are coupled to the load LD through the second power control circuit DRC. The high-side driver circuit HDC and the low-side driver circuit LDC corresponding to the W-phase are coupled to the load LD through the third power control circuit DRC. Also, the three high-side driver circuits HDC are each coupled with a power supply VT different from each other.

The separation region SPR is disposed for each of the three high-side driver circuits HDC. The configurations of the separation region SPR and the coupling transistor TR are identical with those in any one of the first to fifth embodiments.

In the example shown in the figure, three sets of the control circuit LGC, the level shift circuit LSC, the high-side driver circuit HDC, and the low-side driver circuit LDC are disposed in one semiconductor device SD. However, the electric device illustrated in FIG. 17 may have three semiconductor devices SD each having one set of the control circuit LGC, the level shift circuit LSC, the high-side driver circuit HDC, and the low-side driver circuit LDC.

The invention made by the present inventors has been described above specifically on the basis of the embodiments. However, the present invention is not limited to the above embodiments, but can be variously modified without departing from the spirit of the invention.

What is claimed is:
1. A semiconductor device comprising:
a substrate;
a first circuit region on the substrate, the first circuit region including a first circuit having first power supply voltage;
a second circuit region on the substrate, the second circuit region including a second circuit having a second power supply voltage lower than the first power supply voltage;
a separation region, on the substrate, surrounding the first circuit region to separate the first circuit region from the second circuit region, the separation region including:
a first coupling transistor for coupling the first circuit to the second circuit, the first coupling transistor having a control electrode, a first electrode, and a second electrode, the first electrode being disposed on the side of the first circuit region, the second electrode being disposed on the side of the second circuit region; and
a layer-structured first field plate electrode at least partially surrounding the first circuit region, wherein
the first field plate electrode has a first portion, on the side of the first circuit region, coupled to the first electrode of the first coupling transistor, and a second portion, on the side of the second circuit region, coupled to a ground potential or the second circuit.

2. The semiconductor device according claim 1, wherein the layer-structured first field plate electrode is plurally-folded one electrode at least partially surrounding the first circuit region, or one electrode spirally surrounding the first circuit region.

3. The semiconductor device according to claim 1, wherein the first and second electrodes of the first coupling transistor are drain and source electrodes, respectively.

4. The semiconductor device according to claim 3, wherein the first portion of the first field plate electrode is closest to the first circuit region, and electrically coupled to the drain electrode of the first coupling transistor.

5. The semiconductor device according to claim 3, wherein the second portion of the first field plate electrode is closest to the second circuit region, and applied with a power potential or a ground potential of the second circuit.

6. The semiconductor device according to claim 1, wherein the separation region further includes:
a second coupling transistor for coupling the first circuit to the second circuit, the second coupling transistor having a control electrode, a first electrode, and a second electrode; and
a layer-structured second field plate electrode at least partially surrounding the first circuit region, and
the second field plate electrode has a third portion, on the side of the first circuit region, coupled to the first electrode of the second coupling transistor, and a fourth portion, on the side of the second circuit region, coupled to a ground potential or the second circuit.

7. The semiconductor device according to claim 6, wherein the first field plate electrode has a fifth portion closest to the second circuit region,
the second field plate electrode has a sixth portion closest to the second circuit region, the sixth portion being electrically coupled to the fifth portion.

8. The semiconductor device according to claim 1, wherein the source and drain electrodes are regions of a first conductivity type,
the separation region includes a region of a second conductivity type, the second conductivity type region being disposed around the first coupling transistor; and
the first field plate electrode crosses the second conductivity type region in a plan view.

9. The semiconductor device according to claim 8, wherein a distance between an edge of the first circuit region and an innermost layer of the first field plate electrode relative to the first circuit region is greater than that between the innermost layer and a second innermost layer of the first field plate electrode.

* * * * *